United States Patent
Pobanz et al.

(12)

(10) Patent No.: US 6,621,331 B2
(45) Date of Patent: Sep. 16, 2003

(54) VARIABLE NEGATIVE RESISTANCE CELL FOR BIPOLAR INTEGRATED CIRCUITS

(75) Inventors: Carl W. Pobanz, Topanga, CA (US); Gopal Raghavan, Thousand Oaks, CA (US)

(73) Assignee: HRL Laboratories, LLC, Malibu, CA (US)

( * ) Notice: Subject to any disclaimer, the term of this patent is extended or adjusted under 35 U.S.C. 154(b) by 0 days.

(21) Appl. No.: 09/925,828

(22) Filed: Aug. 7, 2001

(65) Prior Publication Data

US 2003/0030485 A1 Feb. 13, 2003

(51) Int. Cl.[7] ................................................. H03K 3/00
(52) U.S. Cl. ....................... 327/568; 331/115; 330/293; 327/103
(58) Field of Search ........................... 331/57, 109, 115, 331/135, 117; 330/253, 277, 107, 109, 110, 293; 327/568, 103, 326, 498

(56) References Cited

U.S. PATENT DOCUMENTS

| | | | | | |
|---|---|---|---|---|---|
| 3,863,229 A | * | 1/1975 | Gersbach | .............. | 340/173 FF |
| 5,061,901 A | * | 10/1991 | Nicollini et al. | ............ | 330/253 |
| 6,008,701 A | * | 12/1999 | Gilbert | ........................ | 331/57 |

* cited by examiner

*Primary Examiner*—Tuan T. Lam
*Assistant Examiner*—Hiep Nguyen
(74) *Attorney, Agent, or Firm*—Tope-McKay & Associates

(57) ABSTRACT

An effective means and apparatus for generating a negative resistance including a circuit element that exhibits an increase in current as the applied voltage is decreased. Other embodiments of the present invention provide electronic means for improving the quality Q factor of on-chip resonators, which enables the creation of high-performance bipolar RF circuits with a minimum of external components.

21 Claims, 4 Drawing Sheets

VARIABLE NEGATIVE RESISTANCE CELL FOR BIPOLAR INTEGRATED CIRCUITS

TECHNICAL FIELD

This invention relates to a bipolar transistor circuit that is substantially used for generating a two-terminal negative resistance that is useful in compensating for losses and improving the quality (Q) factor of integrated resonators. More specifically, the invention provides a means for generating a broadband negative resistance that is electronically adjustable over a wide range of resistive losses.

BACKGROUND OF THE INVENTION

High-frequency resonators are critical components in oscillators, RF circuits and other circuits. Such resonators are very susceptible to degradation by losses and it is often necessary to separate the resonator from the active semiconductor circuit. The resulting hybrid circuit is generally larger, more difficult to manufacture, and more expensive than a fully integrated circuit. Current circuits use mixed field effect transistor (FET) bipolar processes, or PIN diodes, for adjustment, and rely on reactive components such as inductors or variable capacitors in order to function.

Presently negative resistance circuits are used to enhance Q resonators. The majority of the Q resonators are based on field effect transistors rather than bipolar transistors. This greatly limits their use in the fastest large-scale-integrated circuits such as those using InP and SiGe heterojunction bipolar transistors. Only a small selection of Q resonators allow for the negative resistance to be electronically adjusted, and these either have a small range of adjustment or employ variable reactances in feedback that substantially limit the bandwidth and applicability of the circuit.

Bandpass delta-sigma modulators for signal processing require high-Q resonators with a high signal-to-noise ratio to effectively convert data. However, even the best passive resonators often suffer from prohibitively large losses when integrated onto semiconductor substrates, and implementing the resonator off-chip leads to parasitics and signal delays that cause instability in high performance modulators.

Therefore it would be desirable to integrate circuit components onto a single semiconductor chip in order to reduce the physical size and power consumption of circuit components. This integration could be achieved by inventing an electronic means for improving the Q factor of on-chip resonators. Such an electronic means would enable the creation of high-performance bipolar RF circuits with a minimum of external components. The invention would need to be an electronically adjustable negative resistance circuit configured such that the level of loss compensation would be continuously variable over a wide range of losses. Such a system would ultimately improve performance, reduce cost, increase system versatility, and reduce size.

SUMMARY OF THE INVENTION

The present invention provides an integrated circuit that utilizes an electronic means for improving the Q factor of on-chip resonators. The invention allows for the creation of high-performance bipolar RF circuits with a minimum of external components. The invention utilizes an electronically adjustable negative resistance circuit that is configured to provide a level of loss compensation that is continuously variable over a wide range of losses. The invention results in a circuit having improved performance characteristics, increases the system's versatility, while reducing its size, and further, the costs associated with fabrication and design are generally reduced.

One embodiment of the present invention provides a solution for improving the Q factor, and compensating for loses, in integrated resonators. The embodiments described herein describe a bipolar transistor circuit that has a variable transconductance cell connected with positive feedback to generate a negative resistance at its output terminals.

Another embodiment of the invention relates to a method for generating a two-terminal negative resistance, in a bipolar transistor circuit, using components commonly available in bipolar transistor processes. While yet another embodiment of the invention relates to a circuit element that produces an adjustable negative resistance ranging from a minimum to essentially negative infinity, where the negative resistance is electronically adjustable and continuously variable. Another embodiment of the invention relates to a circuit element that exhibits an increase in current as the applied voltage is decreased, wherein the applied voltage varies due to resistance caused by such factors as imperfectly conducting materials or poorly insulating substrates.

BRIEF DESCRIPTION OF THE DRAWINGS

The objects, features, and advantages of the present invention will be apparent from the following detailed description of the preferred embodiment of the invention in conjunction with reference to the following drawings.

DESCRIPTION OF THE PREFERRED EMBODIMENTS

Figure 1A:
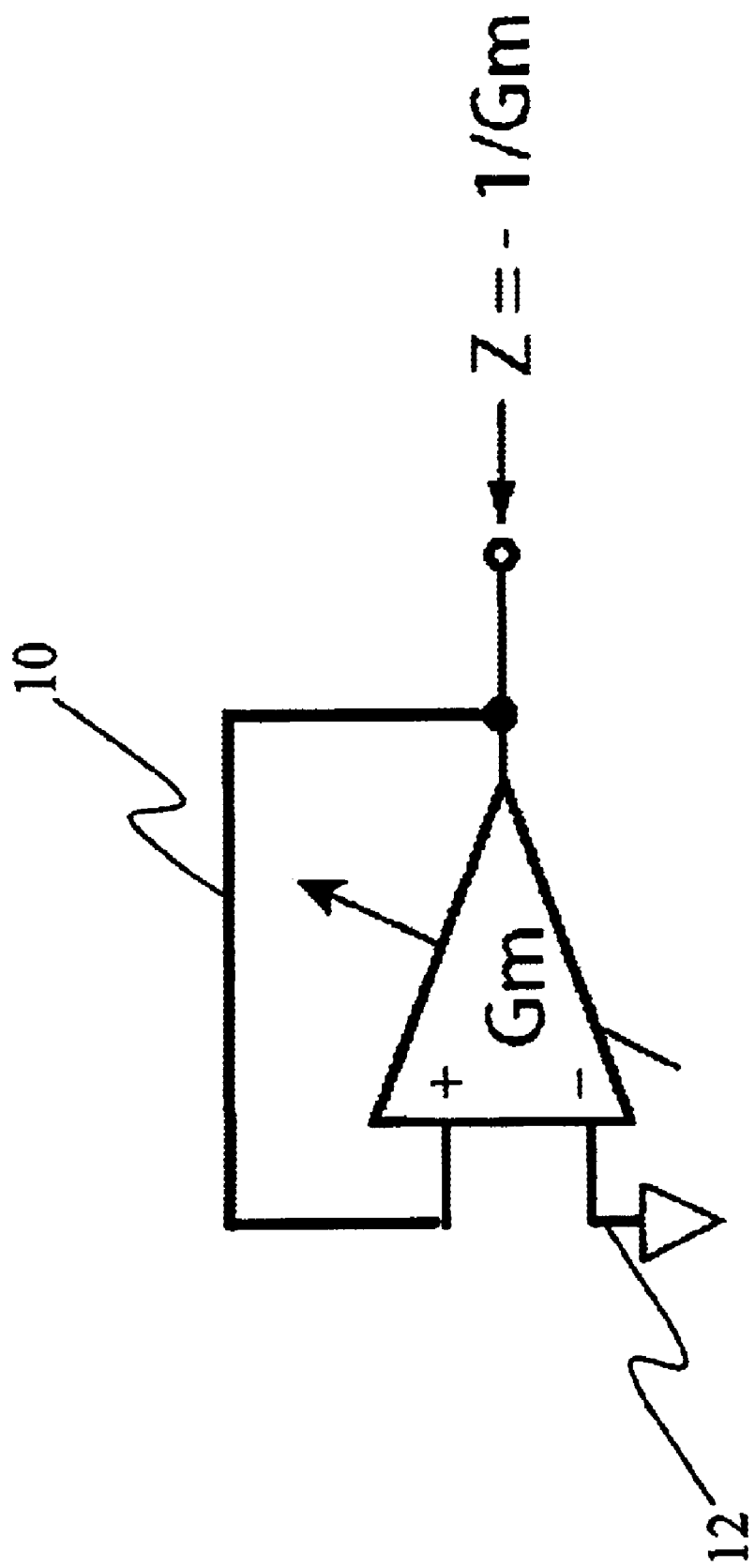
FIG. 1a schematically depicts the variable negative resistance cell.

The present invention is related to a variable transconductance cell connected with positive feedback to generate a negative resistance at its output terminals, and can be tailored to a variety of other applications. The following description, taken in conjunction with the referenced drawings, is presented to enable one of ordinary skill in the art to make and use the invention and to incorporate it in the context of particular applications. Various modifications, as well as a variety of uses in different applications, will be readily apparent to those skilled in the art, and the general principles defined herein may be applied to a wide range of embodiments. Thus, the present invention is not intended to be limited to the embodiments presented, but is to be accorded the widest scope consistent with the principles and novel features disclosed herein. Furthermore it should be noted that unless explicitly stated otherwise, the figures included herein are illustrated diagrammatically and without any specific scale, as they are provided as qualitative illustrations of the concept of the present invention.

The present invention relates to a bipolar transistor circuit that generates a two-terminal negative resistance, which is useful in compensating for losses and improving the Q-factor of integrated resonators. One attribute of the circuit is its ability to generate a broadband negative resistance that is electronically adjustable over a wide range of frequencies, using only components that are commonly available in virtually any bipolar transistor process.

One purpose of the invention is to create a circuit element that exhibits an increase in current as the applied voltage is decreased thereby generating a negative resistance. This invention may be used in integrated circuits to cancel out the resistance due to signal losses in imperfectly-conducting metals or poorly-insulating semiconductor substrates. While high-frequency resonators are critical components in oscillators and other RF circuits, they are very susceptible to degradation by losses, and it is often necessary to separate the resonator from the active semiconductor circuit. One embodiment of the present invention provides an electronic means for improving the quality Q factor of on-chip resonators, which enables the creation of high-performance bipolar RF circuits with a minimum of external components. One of the novel aspects of the present invention is that the level of loss compensation is continuously variable over a wide range and is electronically adjustable. Only a single type of bipolar transistor is needed, which makes the circuit compatible with essentially all high-performance bipolar processes—including InP, GaAs and SiGe heterojunction bipolar transistors. This circuit does not rely on reactive components such as inductors or variable capacitors in order to function, thereby resulting in a broadband response that essentially eliminates the need for any tuning.

Bandpass delta-sigma modulators, used in high-speed oversampled analog-to-digital converters for signal processing, require high-Q resonators to effect data conversion with a high signal-to-noise ratio. This invention will help extend the range of analog-to-digital converters to carrier frequencies up to 10 GHz and beyond.

Electronically enhancing the Q of resonators will allow narrowband, high order filters to be realized on the same substrate with InP heterojunction bipolar transistor electronics, in order to produce, among other things high-performance microwave systems on a single chip.

Figure 1B:
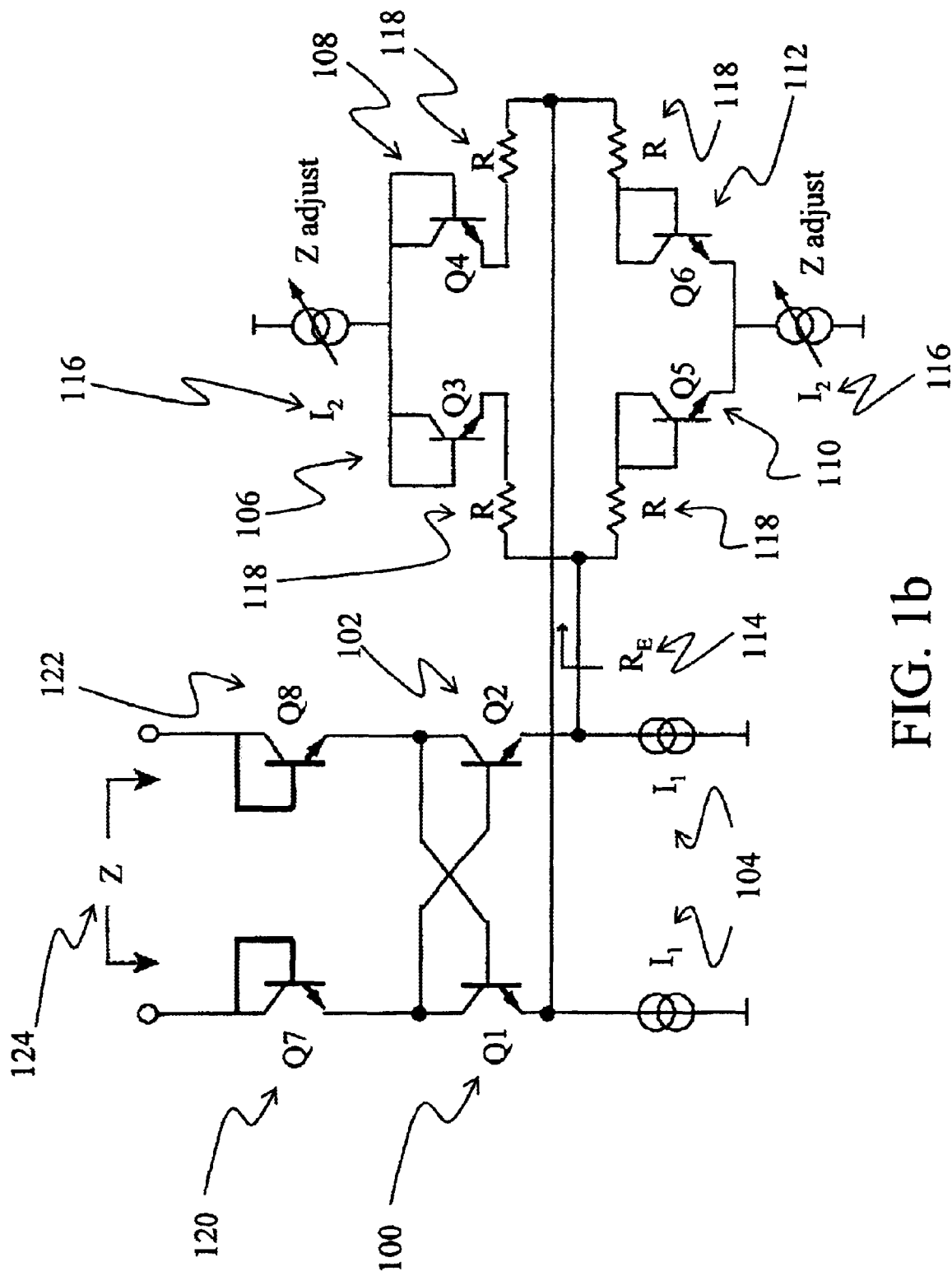
FIG. 1b schematically depicts the concept and bipolar circuit implementation.

One embodiment of the invention includes a variable transconductance cell, shown in FIG. 1a, connected with positive feedback 10 to generate a negative resistance at its output terminals 12. The core of the bipolar circuit, shown in FIG. 1b, is a pair of transistors Q1 100 and Q2 102 biased by current sources $I_1$ 104. The transconductance ($G_m$) is modulated by generating a negative impedance at the emitters of transistors Q1 100 and Q2 102, that emulates a negative feedback, from the variable resistance provided by the bridge circuit Q3 106, Q4 108, Q5 110, and Q6 112 that connects to the emitters of Q1 100 and Q2 102. This emitter degeneration resistance $R_E$ 114 reduces the differential transconductance ($g_m$) of the pair from $g_m$ to:;

$$G_m = \frac{g_m}{1 + g_m R_E / 2}$$

where:

$g_m$ is $I_1/V_T$;

$V_T$—is kT/q;

k—is Boltzmann's constant;

T—is the absolute temperature; and q—is the electron charge.

$R_E$ 114 is varied by adjusting the current $I_2$ 116 in the bridge comprising diode-connected transistors Q3 106, Q4 108, Q5 110, and Q6 112 and resistors R 118. The value of $R_E$ 114 ranges from essentially an open circuit at $I_2$=0 116 to a minimum value of R 118 that occurs when Q3 106, Q4 108, Q5 110, and Q6 112 are strongly forward-biased. Thus, the resistance varies inversely with the bias across transistors Q3 106, Q4 108, Q5 110, and Q6 112. Resistance $R_E$ 114 is substantially linear for moderate values of R 118 and varies inversely with $I_2$ 116, while the symmetry of the bridge configuration minimizes the perturbing effects of current $I_2$ 116 on the external circuit.

The positive feedback required to generate the negative resistance is obtained by cross-coupling the transconductance cell Q1 100 and Q2 102 as shown, which results in an output impedance at the collectors equal to:

$$Z_{collectorQ1-Q2} = -2/G_m = -2\left(\frac{1}{g_m} + \frac{R_E}{2}\right)$$

where:

$Z_{collectionQ1-Q2}$—is the output impedance at the collectors;

$G_m$—is the transconductance; and $g_m$—is the differential transconductance.

Ideally this impedance should be a function only of the variable resistor $R_E$ 114 but the change in $g_m$ that accompanies the varying $R_E$ 114 contributes an undesirable non-linear effect. This is corrected by adding transistors Q7 120 and Q8 122, which generate load impedances for Q1 100 and Q2 102 and are equal to $1/g_m$. The resulting output impedance Z 124 is then simply:

$$Z = -R_E,$$

where:

Z—is the output impedance and $R_E$—is the variable resistance, which is the desired negative resistance, adjustable by $I_2$ 116 from a minimum of –R 118 to essentially negative infinity.

Figure 2:
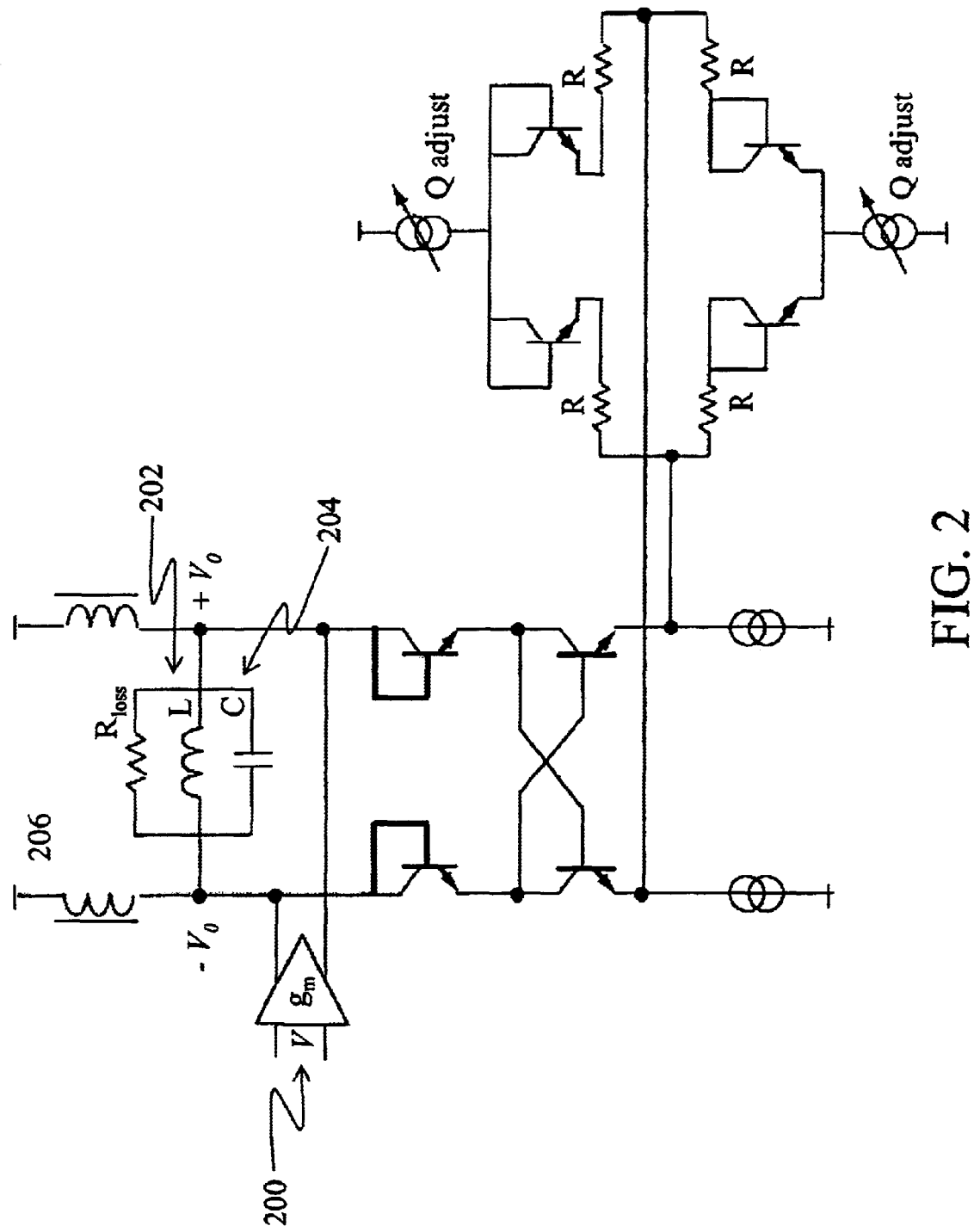
FIG. 2 shows the application of the negative resistance cell in a tuned amplifier stage with an integrated resonator.
Figure 3:
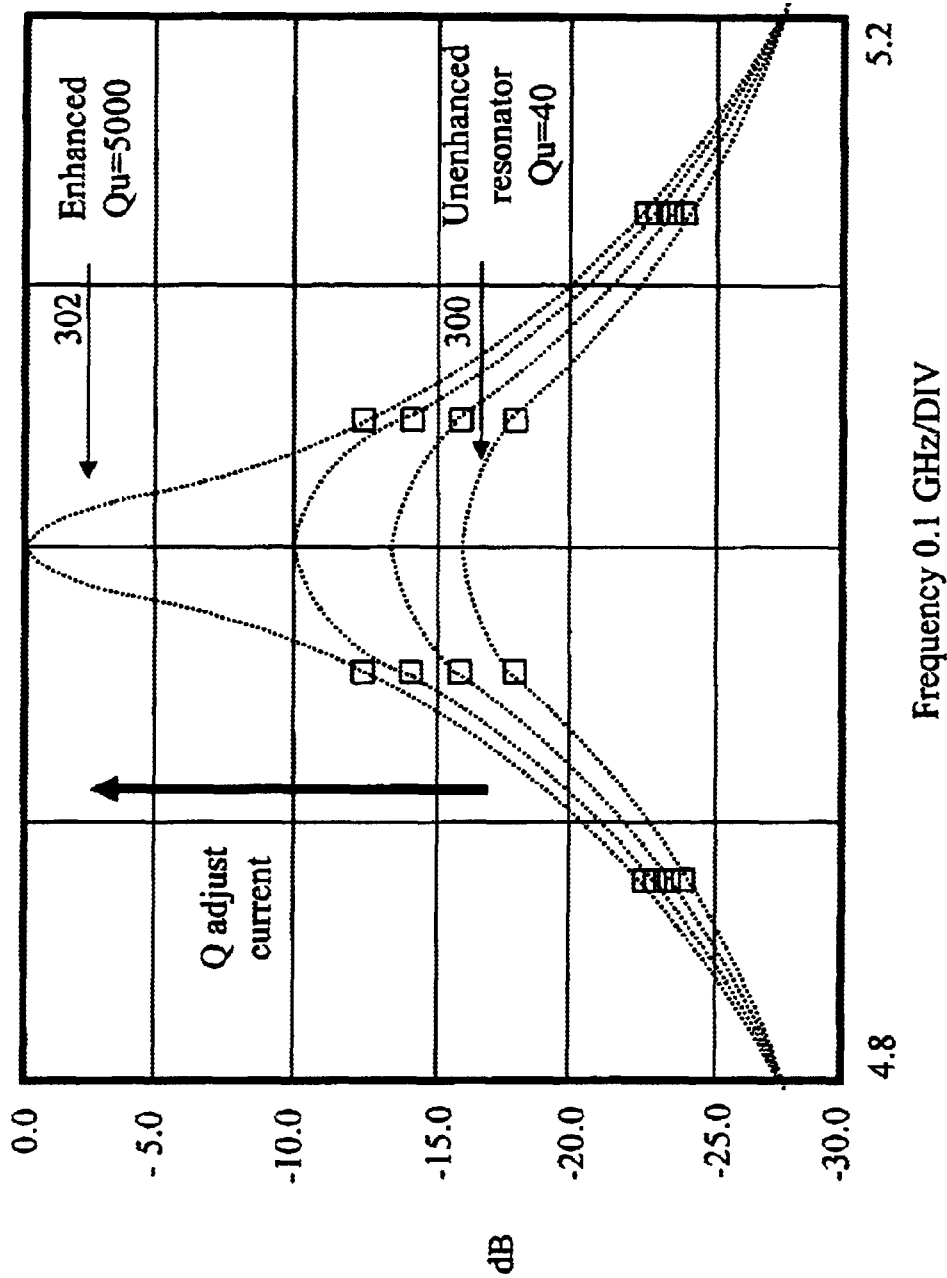
FIG. 3 is a graph showing that the gain versus frequency response is improved by a factor of more than 100.

An illustration of an application of the negative resistance circuit in a 5-GHz tuned amplifier stage is shown in FIG. 2, comprising a $g_m$ 200 cell with a parallel resonant tank as a load. The load results from an on-chip inductor L 202, a capacitor C 204 and an effective loss resistance $R_{loss}$ 206. The negative resistance circuit is placed in parallel with $R_{loss}$ 206 and is adjusted to cancel it. As shown in the normalized gain ($V_o/V$) vs. frequency plot in FIG. 3, the Q of the resonator is increased from its original value of 40 300 to over 5000 302. The loss compensation effected by the negative resistance allows the monolithic amplifier to achieve a narrow bandwidth and excellent selectivity that would otherwise be impossible with an on-chip resonator.

Therefore the present invention provides an integrated circuit that utilizes an electronic means for improving the Q factor of on-chip resonators. The invention allows for the creation of high-performance bipolar RF circuits with a minimum of external components. One embodiment of the present invention utilizes an electronically adjustable negative resistance circuit that is configured to provide a level of loss compensation that is continuously variable over a wide range of losses. The invention results in a circuit having improved performance characteristics, increases the system's versatility, while simultaneously reducing its size. Also, the costs associated with fabrication and design are generally reduced.

What is claimed is:

1. A bipolar transistor circuit comprising;

i. a variable transconductance cell connected with positive feedback to generate a negative resistance at the bipolar transistor circuit's output terminals; and ii. a circuit element that exhibits an increase in current as an applied voltage is decreased, the circuit element connected with the variable transconductance cell to provide a resistance to adjust a differential transconductance of the transconductance cell.

2. The bipolar transistor circuit as in claim 1 wherein the variable transconductance cell includes a pair of transistors biased by a current source applied to the pair of transistor's emitters.

3. The bipolar transistor circuit as in claim 2 wherein the variable transconductance cell is modulated by providing an impedance from a variable resistance source to emulate a negative feedback in the variable transconductance cell.

4. The bipolar transistor circuit as in claim 3 wherein the variable resistance source is provided by a bridge circuit that connects to a pair of transistor emitters.

5. The bipolar transistor circuit as in claim 4
wherein the bridge circuit comprises at least one diode-connected transistor and resistor, and
wherein the bridge circuit current is supplied with an adjustable current source.

6. The bipolar transistor circuit as in claim 5
wherein the at least one transistor has a degeneration resistance which reduces differential transconductance of a pair of transistors, and
wherein the degeneration resistance is varied by adjusting the adjustable current source.

7. The bipolar transistor circuit as in claim 1 wherein the positive feedback required to generate the negative resistance is obtained by cross-coupling the variable transconductance cell which results in an output impedance at the output terminals of the bipolar transistor circuit.

8. The bipolar transistor circuit as in claim 7
wherein the output impedance has a nonlinear effect, and
wherein the nonlinear effect is corrected by adding at least one transistor at the output terminals of the bipolar transistor circuit.

9. A method for producing a bipolar transistor circuit comprising the steps of;
  i. generating a two-terminal negative resistance; and
  ii. generating a negative resistance across a bipolar transistor circuit's output terminals using a variable transconductance cell connected with positive feedback; and
  iii. producing an adjustable negative resistance ranging from a minimum to essentially negative infinity.

10. The method for producing a bipolar transistor circuit described in claim 9 wherein the bipolar transistor circuit is used in compensating for losses and improving quality of integrated resonators.

11. The method for producing a bipolar transistor circuit described in claim 9 wherein the bipolar transistor circuit is configured for helping to extend range of analog to digital converters to carrier frequencies up to, and beyond 10 GHz.

12. The method for producing a bipolar transistor circuit described in claim 10
wherein electronically enhancing the quality of resonators will allow narrow-band, high order filters to be achieved on the same substrate as heterojunction bipolar transistor electronics, and
wherein electronically enhancing the quality of resonators will allow production of a high-performance microwave system on a single chip.

13. The method for producing a bipolar transistor circuit described in claim 10 wherein improving quality of the integrated resonators substantially increases the quality of said integrated resonators by a factor of at least 90.

14. The method for producing a bipolar transistor circuit described in claim 9
wherein the bipolar transistor circuit generating a broadband negative resistance is electronically adjustable over a wide range, and
wherein the bipolar transistor circuit utilizes at least one component that is commonly available in substantially any transistor fabrication process.

15. The method for producing a bipolar transistor circuit described in claim 9
wherein the bipolar transistor circuit is utilized in integrated circuits to substantially attenuate resistance.

16. The method for producing a bipolar transistor circuit described in claim 9
wherein the bipolar transistor circuit is used in integrated circuits to substantially attenuate resistance due to signal losses in imperfectly conducting metals.

17. The method for producing a bipolar transistor circuit described in claim 9
wherein the bipolar transistor circuit is used in integrated circuits to substantially attenuate resistance due to signal losses in poorly insulating semiconductor substrates.

18. The method for producing a bipolar transistor circuit described in claim 9
wherein the bipolar transistor circuit is providing an electronic means for obtaining an improved quality factor of on chip resonators; and
wherein the improved quality factor allows for creation of high performance bipolar RF circuits with a minimum of external components.

19. The method for producing a bipolar transistor circuit described in claim 9 wherein the bipolar transistor circuits level of compensating for losses is continuously variable over a wide range of losses and is electronically adjustable.

20. The method for producing a bipolar transistor circuit described in claim 9 wherein only a single type of bipolar transistor is required thereby making the bipolar transistor circuit compatible with high-performance bipolar processes.

21. The method for producing a bipolar transistor circuit described in claim 20 wherein the bipolar transistor circuit is relies on components other than reactive components of variable capacitors in order to function, resulting in a broadband response that substantially eliminates the need for tuning.

* * * * *